United States Patent
Tixhon et al.

(10) Patent No.: US 8,470,095 B2
(45) Date of Patent: *Jun. 25, 2013

(54) PROCESS AND INSTALLATION FOR SURFACE PREPARATION BY DIELECTRIC BARRIER DISCHARGE

(75) Inventors: Eric Tixhon, Crisnee (BE); Joseph Leclercq, Evere (BE); Eric Michel, Uckange (FR)

(73) Assignee: AGC Glass Europe, Brussels (BE)

( * ) Notice: Subject to any disclaimer, the term of this patent is extended or adjusted under 35 U.S.C. 154(b) by 84 days.

This patent is subject to a terminal disclaimer.

(21) Appl. No.: 13/054,311

(22) PCT Filed: Jul. 16, 2009

(86) PCT No.: PCT/EP2009/059158
§ 371 (c)(1),
(2), (4) Date: Mar. 31, 2011

(87) PCT Pub. No.: WO2010/007135
PCT Pub. Date: Jan. 21, 2010

(65) Prior Publication Data
US 2011/0174333 A1    Jul. 21, 2011

(30) Foreign Application Priority Data
Jul. 16, 2008 (EP) .................................... 08160512

(51) Int. Cl.
*C23G 16/4405* (2006.01)
(52) U.S. Cl.
USPC .............. 134/1.1; 216/59; 216/67; 216/68; 216/69; 216/70; 216/71; 438/710; 438/714; 438/726; 438/727; 438/728; 438/729; 438/730; 438/731; 438/732; 438/906; 257/E21.226; 257/E21.227; 118/723 E; 156/345.43; 156/345.44; 427/533; 427/535; 134/1; 134/1.2; 134/25.4; 134/42; 134/902

(58) Field of Classification Search
USPC .............. 216/59, 67, 68, 69, 70, 71; 438/710, 438/714, 726, 727, 728, 729, 730, 731, 732, 438/906; 257/E21.226, E21.227; 118/723 E; 156/345.43, 345.44; 427/533, 535; 134/1, 134/1.1, 1.2, 25.4, 42, 902
See application file for complete search history.

(56) References Cited

U.S. PATENT DOCUMENTS
4,871,421 A * 10/1989 Ogle et al. .................... 438/710
5,910,886 A *  6/1999 Coleman ......................... 363/17
(Continued)

FOREIGN PATENT DOCUMENTS
EP      1 381 257      1/2004
JP      2001 35693     2/2001

OTHER PUBLICATIONS
International Search Report Issued Nov. 6, 2009 in PCT/EP09/059158 filed Jul. 16, 2009.
(Continued)

Primary Examiner — Bibi Carrillo
(74) Attorney, Agent, or Firm — Oblon, Spivak, McClelland, Maier & Neustadt, L.L.P.

(57) ABSTRACT

A process for surface preparation of a substrate (2), which comprises introducing or running a substrate (2) into a reaction chamber (6, 106). A dielectric barrier (14, 114) is placed between electrodes (1, 10, 110). A high-frequency electrical voltage is generated, to generate filamentary plasma (12, 112). Molecules (8, 108) are introduced into the reaction chamber (6, 106). Upon contact with the plasma, they generate active species typical of reacting with the surface of the substrate. An adjustable inductor (L) placed in parallel with the inductor of the installation is employed to reduce the phase shift between the voltage and the current generated and to increase the time during which the current flows in the plasma (12, 112).

8 Claims, 5 Drawing Sheets

U.S. PATENT DOCUMENTS

| | | | |
|---|---|---|---|
| 2003/0115965 A1* | 6/2003 | Mittelstein et al. | 73/706 |
| 2004/0007985 A1 | 1/2004 | de Vries et al. | |
| 2006/0081566 A1* | 4/2006 | DeVries et al. | 219/121.48 |
| 2007/0205727 A1 | 9/2007 | Tamita et al. | |
| 2011/0183083 A1* | 7/2011 | Tixhon et al. | 427/569 |
| 2011/0200763 A1* | 8/2011 | Tixhon et al. | 427/569 |

OTHER PUBLICATIONS

U.S. Appl. No. 13/054,090, filed Jan. 14, 2011, Tixhon, et al.

U.S. Appl. No. 13/054,284, filed Jan. 14, 2011, Tixhon, et al.

* cited by examiner

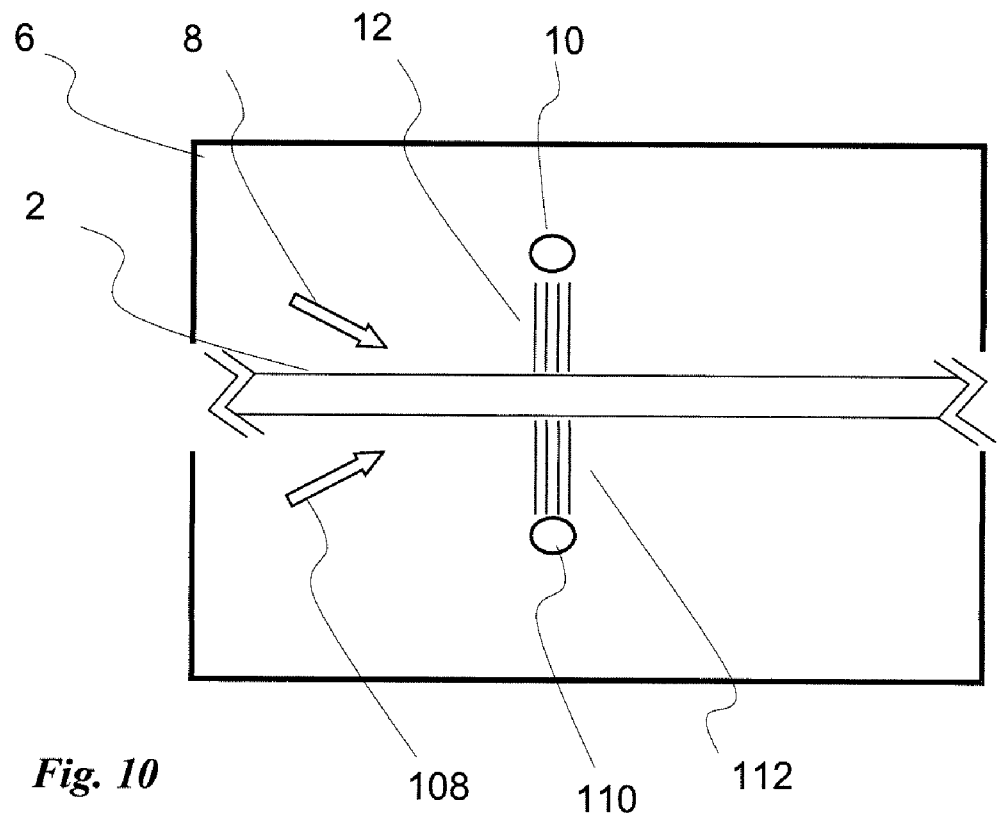
*Fig. 10*
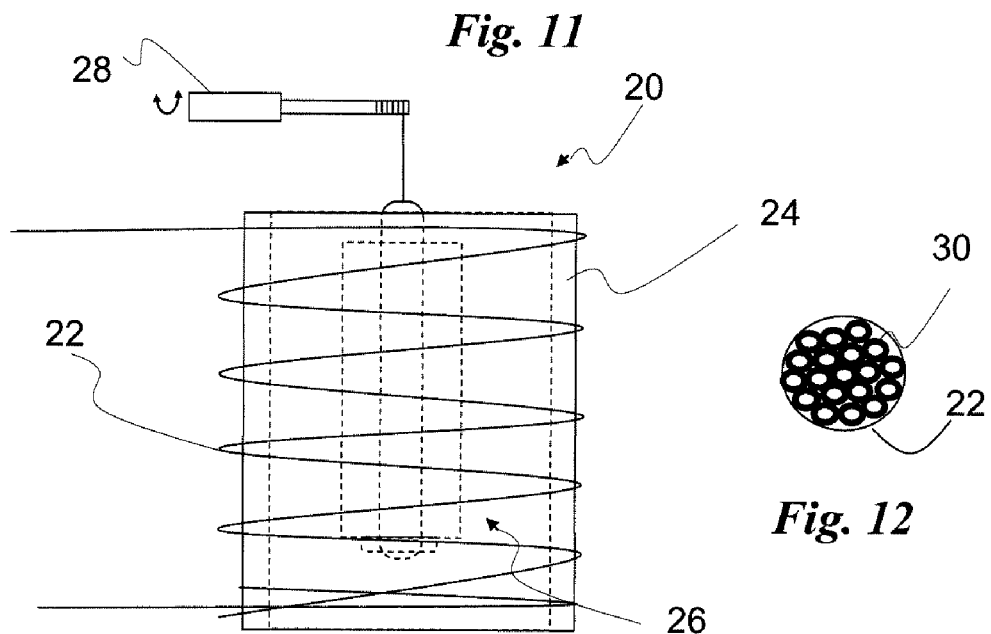
*Fig. 11*
*Fig. 12*

PROCESS AND INSTALLATION FOR SURFACE PREPARATION BY DIELECTRIC BARRIER DISCHARGE

FIELD OF THE INVENTION

The invention relates to processes and installations for the surface preparation of inorganic substrates prior to their treatment.

PREAMBLE

Various operations exist for improving the quality of raw materials, such as glass, steel or plastic, etc. Among these operations are surface treatment and surface preparation. Here, surface treatment refers to treatment during film deposition on a substrate, whereas surface preparation consists, as its name indicates, either in preparing the surface of a substrate, so as to make said surface capable of receiving a coating, or in modifying its surface properties by creating new bonds (surface activation). The invention relates to a process of preparing a surface by dielectric barrier discharge (DBD) for cleaning, degreasing, brightening, pickling or else activating the surface, so as to modify and/or improve the surface properties of said substrate. In particular, the aim of the invention is to prepare the surface for the purpose in particular of cleaning the substrate, by removing the organic layers or contaminants, of brightening the surface, by removing the inorganic layers or contaminants, or else of activating the surface by creating new bonds on the surface of the substrate.

The invention also relates to an installation for applying the DBD process in question, especially continuously.

PRIOR ART

The objective of the main operations for preparing a surface are to remove, firstly, the organic residues (for example oils) and all dirt retained thereby. This operation is called generically "cleaning" or "degreasing". Secondly, the surface undergoes a treatment to reduce the oxides, when they are present. This operation generically referred to as "pickling" or "brightening". These operations are key operations in a complete industrial process since, if they are poorly controlled, problems may arise (lack of adhesive of the coatings produced after surface preparation; low corrosion resistance; appearance problems) and the quality of the end product cannot be guaranteed.

Two surface preparation techniques may mainly be distinguished: wet processing, especially electrochemical processing, with the use of basic or acid solutions, and dry processing, especially by the use of a plasma discharge.

Surface preparation is at the present time essentially carried out by "wet" processing. To increase the efficiency of the process, surface preparation is often combined, in the case of an electrically conductive substrate, with an electrolytic action.

In particular in the case of metallurgy, the first operation of surface preparation by wet processing is coarse cleaning by the use of a solvent. This operation helps to remove most of the organic contaminants. The second operation is a chemical degreasing (in a bath). These degreasing operations are both intended to destroy the thin oily residue, and they remove 95 to 98% of the organic layer. After this surface preparation, the residual contamination is of the order of 1 mg/m$^2$.

A degreasing bath is in general made up of an NaOH-based solution and additional products. The sodium hydroxide gives the solution a saponifying action.

In the case of a conductive substrate, an electrolytic degreasing operation is generally employed, such as electrofinishing. The solution is used as electrolyte and the material to be treated occupies the anode position and/or the cathode position alternately. A compromise lies in the use of alternate strip biases of the cathode-anode/anode-cathode type. The composition of the electrolytic baths is similar to the decreasing solutions, but the operating conditions differ depending on the nature of the bath. Chemical and electrolytic degreasing operations are used to remove the organic interface chemically bonded to the substrate, by giving it the required wettability for a subsequent surface treatment. After this surface preparation, the residual contamination is of the order of 0.1 mg/m$^2$.

Again in the field of metallurgy, after electrolytic degreasing, it is often necessary to etch the surface so as to remove the oxides possibly present. Given the basic or amphoteric character of oxides, an acid pickling solution (sulphuric acid $H_2SO_4$ or hydrochloric acid HCl) is used. In the case of a conductive substrate, electrolytic pickling may also be added. As in the case of degreasing, alternate biases are used for the pickling. In general, they are of the cathode-anode/anode-cathode type, although other combinations are possible.

However, since environmental and safety standards are becoming increasingly restrictive and strict, these processes are becoming very expensive as industries are required to limit the quantities used and to recycle the wastewater before discharge.

One possible solution to the environmental problems consists in replacing the surface preparation obtained by "wet" processing by the use of a vacuum plasma or high-pressure plasma technology. This technique has the advantages of being an environmentally friendly "dry" process. In the field of surface preparation (surface cleaning, brightening and activation), the plasmas frequently used are plasmas in which the temperature of the gas is close to ambient temperature (non-equilibrium plasma). They allow surface preparation of materials without modifying their mechanical properties.

The active species (electrons, ions, metastables, radicals, etc.) of the plasma that are thus created typically possess energies of a few eV and may thus cause dissociation or activation of surface chemical bonds.

Various plasma types are known in plasma technologies:

<<Glow discharge plasma>> or homogeneous plasma allows deposition of very homogeneous thin-film coatings and requires a relatively low energy level. However, it is lengthy and must be limited within a restricted frequency field to remain stable. It also allows a more restricted variety of thin-film species.

Raising the energy level of plasma may cause the outbreak of electric arcs. Placing a dielectric plate between the electrodes allows obtaining an intermediate state between glow discharge and electric arcs, named "filamentary" state. Filaments are intrinsically unstable but carry a high energy level, allowing a reduction of the time of processing and thus to accelerate the speed of the substrate. On the other side, owing to their random production, a paradoxically homogeneous deposition rate of materials is obtained, a very high number (typically, 10$^6$ per square centimeter per second) of microdischarges being produced during a cycle on a given area.

EP-1 381 257, JP 2001 035693 and US 2007/205727 propose installations for generating a glow-discharge plasma. However, these installations have RLC-type control circuits in the secondary of the HT transformers used and their function is essentially to stabilize the type of discharge obtained. These documents do not offer the advantage of operating both at low pressure and at atmospheric pressure, and of allowing continuous treatment on large areas, which implies producing active electrical power in the order of up to one MegaWatt, as do the present invention.

The table below summarizes the main differences between the conventional chemical process and the plasma process.

| Conventional chemical process | Plasma process |
|---|---|
| Process very sensitive to time and to chemical concentration. | Easy control of the parameters (nature of the gas, pressure, treatment time, transferred energy, etc.). |
| The reliability of the process requires the removal or neutralization of the residues, which may require multiple steps. | No effluents. |
| Costly reprocessing of large quantities of liquid waste. | The waste produced is generally gaseous and can normally be discharged into the atmosphere. |
| Many of the acids and solvents used in this process are hazardous. | The gases used are in general non-toxic. |
| Known, reliable and proven | New. |

To sustain the non-equilibrium plasma (cold plasma), it is often necessary to work at reduced pressure. Most known plasma techniques therefore use low-pressure plasma. Many studies have therefore been carried out in the reduced-pressure plasma field. However, this technique has a number of disadvantages. One advantage with this type of process is that it is not possible to treat materials that have high vapour pressures. Another major disadvantage of low-pressure processes (e.g. vacuum etching) is, in addition to their pumping and equipment investment cost, the relatively low efficiency of the process. This has justified research on new processes resulting in cold plasmas being obtained at high pressure or at atmospheric pressure.

Various plasma processes are used at the present time for preparing the surfaces of various substrates. They may be distinguished in particular by the way in which the energy is generated for producing the active species necessary for the surface preparation. Among these various processes, the DBD process combines the advantages of non-equilibrium plasmas without the drawbacks posed by the problem of having a vacuum. In addition, it seems promising for large-area surface preparation. The substrates involved may be of various types: glass, steel, ceramic, etc. Since the DBD process generates cold (non-equilibrium) plasmas, it may also be applied to various substrates that are even heat-sensitive, such as organic polymers, thermoplastics, etc.

We have chosen to use a DBD as this has the advantage, compared with other plasma processes, of operating both at high pressure and at atmospheric pressure, of generating a cold plasma and of allowing continuous preparation over large areas.

Moreover, the process chosen results in an "activated" surface, enabling better bonding of materials or topcoats to be achieved.

However, the DBD process has the major drawback of having a mediocre energy efficiency: most of the power generated is dissipated at a pure loss. The problem is due largely to the capacitive impedance of the discharge circuit, which is higher the larger the distance between the electrodes (and consequently the larger the distance between the electrodes and a substrate placed therebetween). The energy dissipated in the discharge is therefore limited, thereby reducing the surface decontamination/activation efficiency of the process.

SUMMARY OF THE INVENTION

One object of the invention is to improve the yield and efficiency of a DBD process for surface preparation.

Another object of the invention is to ensure that this efficiency improvement is maintained whatever the imposed conditions. The latter may for example vary: by the type of surface to be prepared (thickness of the substrate, nature of the substrate, etc.), by the nature of the various organic or inorganic layers to be removed, etc.

One subject of the invention is a process for the surface preparation of an inorganic substrate, which comprises the following operations:

a substrate is introduced into or made to run through a reaction chamber in which at least two electrodes are placed, at least one dielectric barrier being placed between these at least two electrodes;

an amplitude- and frequency-stabilized high-frequency voltage is generated, said voltage being such that it generates a filamentary plasma between the at least two electrodes;

an adjustable inductor placed in parallel with the inductor of the installation generating the voltage is employed so as to reduce the phase shift between the voltage and the current that is generated;

molecules of at least one type are introduced into the reaction chamber, such that, upon contact with the plasma, they generate active species capable of reacting with the surface of the substrate;

the voltage and/or the frequency delivered by the generator circuit and/or the inductance are/is adapted at the start of or during the process, so as to obtain optimum reaction characteristics; and the substrate is kept in the chamber for a period of time sufficient to obtain the desired surface preparation.

It should be noted that the process of the invention is defined in terms of "operations" rather than of "steps", that is to say the succession of operations is not necessarily carried out in the order in which they are indicated above.

An advantage of the process of the invention is that the introduction of an inductor into the circuit improves the power factor of the installation, thereby making possible a considerable increase in its efficiency but also making it possible for the process to generate sufficient active energy for obtaining a high surface preparation efficiency.

According to a preferred embodiment, the voltage and/or the frequency delivered by the generator circuit and/or the value of the inductance are/is modulated so as to promote the production of harmonics extending the time during which the voltage remains above the value for sustaining the arc, this having the consequence that the plasma generation time is extended.

One advantage of this embodiment is that, for the same consumed power, the efficiency of the process is greatly improved.

According to an advantageous embodiment, the process further includes the following operation: the position and/or the configuration of the electrode are/is varied so as to obtain optimum reaction characteristics.

Specifically, these criteria are used to vary the characteristics of the electrical circuit and they therefore have an influence on the configuration of the current.

According to an advantageous embodiment, the process further includes the following operation: the atmosphere in the chamber is brought to a predetermined pressure.

According to a preferred embodiment, the chamber is open and comprises an entry zone and an exit zone for the substrate, thereby enabling the process of the invention to be integrated into a continuous surface treatment operation.

Advantageously, the substrate is insulating and itself forms a dielectric barrier placed between the at least two electrodes.

Advantageously, the substrate is conducting and itself constitutes an electrode.

The molecules are introduced into the reaction chamber preferably in the form of a sprayed liquid, gas or a powder.

Another subject of the invention is an installation for surface preparation, which comprises: a chamber; transport means and support means for introducing or running a substrate into the chamber. A high-voltage high-frequency power supply is connected to at least two electrodes placed on each side of the substrate and at least one dielectric barrier is placed between the at least two electrodes. Power supply regulation/control means are provided, as are means for introducing into the chamber molecules suitable for generating, upon contact with the plasma, active species capable of reacting with the surface of the substrate. Residual gas extraction means are also provided. In this installation, an adjustable inductor is placed in parallel with the power supply circuit. The characteristics of this adjustable inductor are such that it enables the phase shift between the voltage generated between the electrodes and the total current delivered by the high-voltage source to be modulated.

One advantage of this installation is that it can be produced by applying a series of relatively minor modifications to existing installations.

In this installation, the power supply regulating means and the inductance control means are advantageously coupled so as to allow the generation of harmonics extending the time during which the voltage between the electrodes is maintained at a value above that for sustaining the electrical discharge.

According to an advantageous embodiment, the chamber is open at both its ends, thereby enabling the surface preparation process to be incorporated into a continuous production plant. Within this context, the chamber may advantageously be incorporated into a steel production line.

According to an advantageous embodiment, the installation is incorporated into a production line that includes a deposition installation, the chamber being placed upstream and/or downstream of the deposition installation, the substrate support and/or transport means comprising at least one roller.

The plasma may, advantageously, be generated in two separate zones, one on each side of the substrate, in such a way that the surface preparation is placed on each side of the substrate simultaneously.

The power of the installation is preferably of at least 100 kW, or better of at least 200 kW. Preferably, the power of the installation is of at least 500 kW. In practice, the power of the plant can go up to more than 1 MW.

According to an advantageous embodiment, the installation comprises a phase-shifting inductor. This inductor comprises a coil consisting of a bundle of conducting elements, insulated from one another, which is wound around a mandrel; a magnetic plunger core placed inside this mandrel and isolated from this mandrel, divided into several sections by inserts; a positioning device connected to the plunger core; an insulating connection connecting the plunger core to the positioning device; and a control system capable of acting on the positioning device, so as to adjust the position of the magnetic plunger core relative to the mandrel.

BRIEF DESCRIPTION OF THE DRAWINGS

Other advantages and features of the invention will become apparent from the following detailed description of particular embodiments of the invention, reference being made to the figures in which:

FIG. 10 is a schematic side view of an embodiment of an installation in the case of an insulating substrate.

FIG. 11 is a schematic side view of an induction coil for an installation according to the invention; and FIG. 12 is a cross-sectional view of a strand of the winding wire used in the induction coil shown in FIG. 11.

The figures are not necessarily drawn to scale.

In general, similar elements are denoted by similar references in the figures, the numbering of some of them serving for distinguishing variants of the same element.

DETAILED DESCRIPTION OF PARTICULAR EMBODIMENTS

Figure 1:
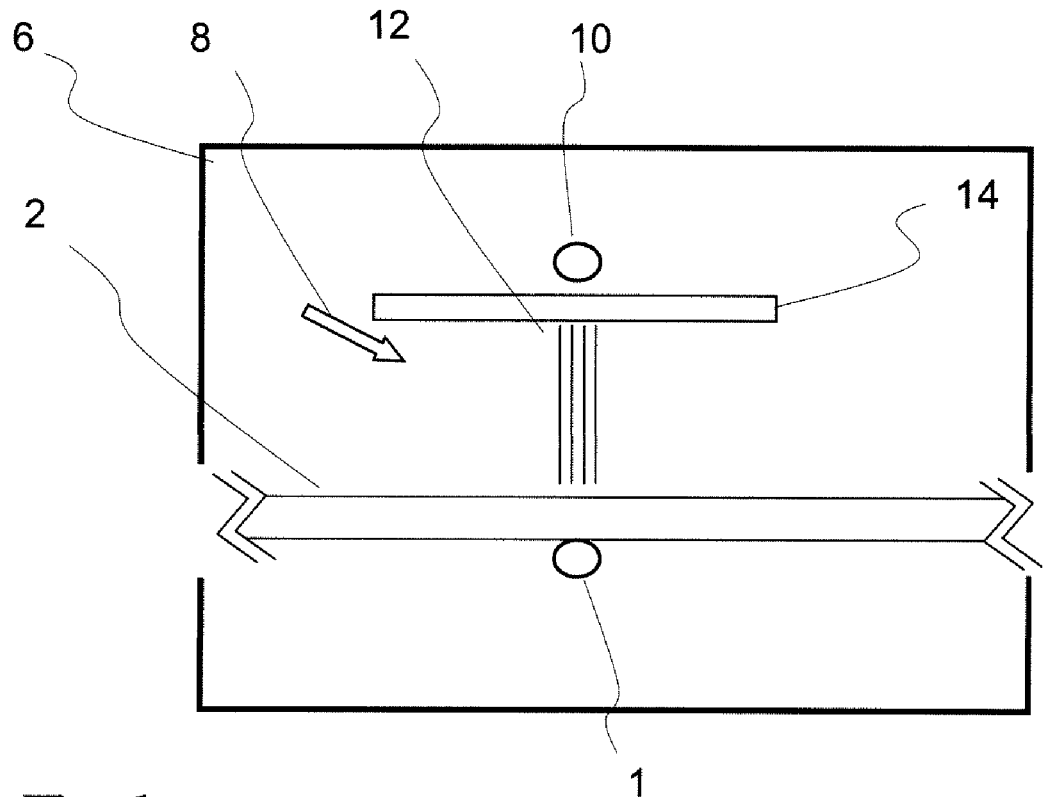
FIG. 1 is a schematic side view of an installation for surface preparation.

FIG. 1 is a schematic view of the installation according to the invention, which here is applied to the continuous production of glass by the "float glass" process. In particular, the treatment chamber is placed in the annealing Lehr. The direction of movement corresponds to the plane of the sheet in the drawing. During its running movement, the glass sheet 2 enters a "chamber" 6 open at both its ends (entry and exit). Molecules 8 intended to produce reactive species are introduced into the chamber 6. It should be noted that the way of introducing these molecules (counter-currently in FIG. 1) is given by way of example, which does not exclude any other form of introduction (perpendicular to the substrate, etc.).

Two electrodes 1, 10 extending along an axis perpendicular to the run direction of the glass sheet 2 are placed in the chamber 6. The shape of the electrode depicted in FIG. 1 is given by way of example. Any other geometry is not excluded.

Since a high-frequency high voltage is applied between these electrodes 1, 10, a plasma 12 (shown schematically by a series of parallel lines) is generated, a series of parallel lines), thereby generating active species derived from the molecules 8 introduced into the chamber 6, making surface preparation possible. The voltage is preferably between 1 kV and 200 kV peak to peak, more preferably between 5 kV and 100 kV peak to peak and even more preferably between 10 kV and 40 kV peak to peak. The frequency is preferably between 10 kHz and 1000 kHz, more preferably between 20 kHz and 400 kHz and even more preferably between 50 kHz and 200 kHz.

To reduce the possible risk of forming electric arcs directly between the two electrodes, a dielectric barrier 14 may be placed in the chamber between the positions of the two electrodes 1, 10. Since the chamber 6 is of the open type, it is necessary to also use powerful extraction means which remove the reaction products generated by the process. It goes without saying that what has been described above in the annealing Lehr of a continuous glass production applies mutatis mutandis in particular to a continuous steel production. In the case of glass production and steel production, the electrode 1 may also advantageously serve as substrate support/transport means. Moreover, in the particular case in which the substrate is conductive, as is the case in metallurgy, said substrate may itself act as one electrode.

The problem that generally arises in this type of process, whenever it is desired to take it from the experimental stage to industrial production, is the low efficiency obtained with regard to the energy consumed to generate the plasma. As a consequence, this efficiency must be improved so as to make the process not only energetically profitable but also to allow the process to generate sufficient active energy to be efficient. A thorough study of all the factors involving energy was therefore undertaken, thereby making it possible to reduce, very schematically, the installation in question to two equivalent circuit diagrams, as shown in FIGS. 2 and 3.

Figure 2:
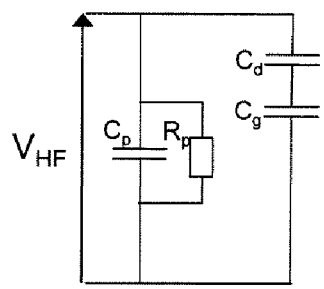
FIG. 2 is an equivalent circuit diagram for the installation of FIG. 1 before plasma formation.

FIG. 2 is a very simplified equivalent circuit diagram for the installation before ignition, a high voltage being applied between the electrodes 1, 10. Installing the discharge in the chamber 6 essentially amounts to adding capacitances in parallel and in series, namely $C_p$ (parasitic capacitance in parallel with a parasitic resistance $R_p$), $C_d$ (capacitance of the dielectric and/or of the substrate), and $C_g$ (capacitance of the gas).

Figure 3:
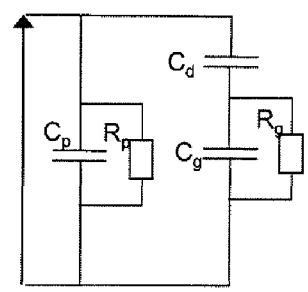
FIG. 3 is an equivalent circuit diagram for the installation of FIG. 1 after plasma generation.

FIG. 3 shows the same circuit diagram when the plasma is generated. At this moment, $C_g$ is shunted by a resistance $R_g$, which represents the resistance of the plasma.

In the absence of a discharge (i.e. as long as the voltage applied between the electrodes is below the ignition voltage), the value of $R_g$ is extremely high, and the total current delivered by the source is in practice purely capacitive, the reactive part being essentially dependent on the dielectric loss in the insulator of the upper electrode and/or the lower electrode and on the substrate. During discharge, the "useful" current $I_g$ flowing through the plasma always remains low compared with its capacitive component. The use of the voltage source is therefore limited, the delivered power being dissipated in producing a very high reactive current, whereas only the active component, delivering the "watted" (i.e. in-phase) power to the discharge ($P_w = R_g I_g^2$), is useful.

Figure 4:
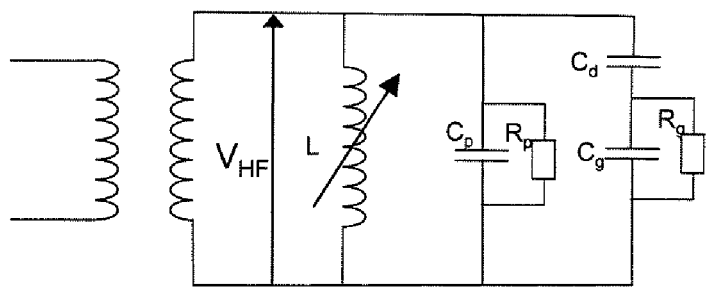
FIG. 4 is an equivalent circuit diagram for the installation according to the invention.

To compensate for the lack of watted power, consideration was given to placing an induction coil L acting as "energy reservoir" in parallel with the installation, making it possible to generate a current in phase opposition with the energy absorbed by the capacitive load. This allows almost complete recovery of the energy involved. An equivalent circuit diagram as shown in FIG. 4 is therefore obtained.

However, it should be pointed out that this type of compensation is not similar to the compensation obtained for example by placing an induction coil in parallel with a current distribution line. This is because what is involved here is not a fixed capacitive component, as is the case in a distribution network, but a load eminently variable according to the frequency (here, kilohertz frequency), the thickness of the substrate and the reactants introduced into the chamber (which induce variations in the electrical and dielectric properties of the gas and the plasma, etc.). As a consequence, it is necessary to employ a very particular type of induction coil, capable not only of withstanding the loading conditions generated in a high-power installation, at high voltage, of course, but also at high frequency, and also having the possibility of being adjusted relatively finely according to the imposed conditions during each type of surface preparation. This is because the resultant load will vary, in particular according to the various process parameters such as, for example, the nature of the active species generated, the thickness of the glass, the gap between the substrate and each of the electrodes. This gap is preferably between 0.5 mm and 100 mm, more preferably between 1 mm and 20 mm and even more preferably between 3 mm and 6 mm.

Various trials showing the possibility of employing the process of the invention in a concrete practical manner brought to light an advantageous and unexpected consequence of this process.

Figure 5:
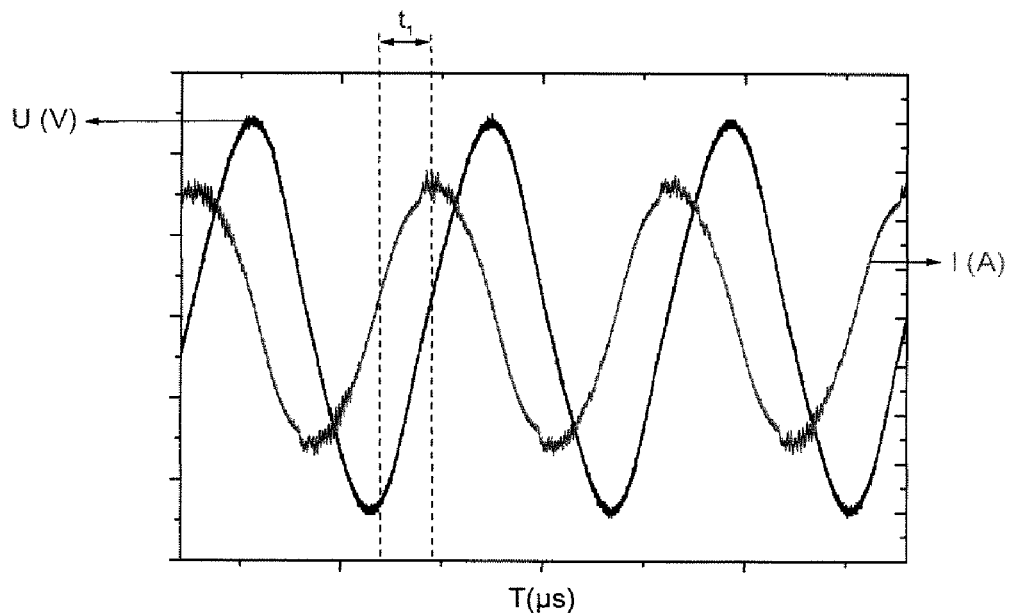
FIG. 5 is a voltage/current oscillogram in a conventional installation.

FIG. 5 shows that another phenomenon is responsible in part for the mediocre efficiency of a DBD plasma surface preparation installation: when an HF high voltage is applied, for each half-period, a discharge can be sustained only over the time period $t_1$ when the applied voltage is above an ignition voltage $V_1$. This time interval is intimately linked to the parameters described above. Of course, this phenomenon is repeated each half-period. The efficiency of the process is therefore limited by the ratio of $t_1$ to the length of a half-period.

According to Fourier's law, if a source supplies a non-linear dipole, the resulting current will not be linear and will have a complex form which may be decomposed into a superposition of several curves, i.e. those having a "fundamental" frequency and a sum of harmonics.

Figure 6:
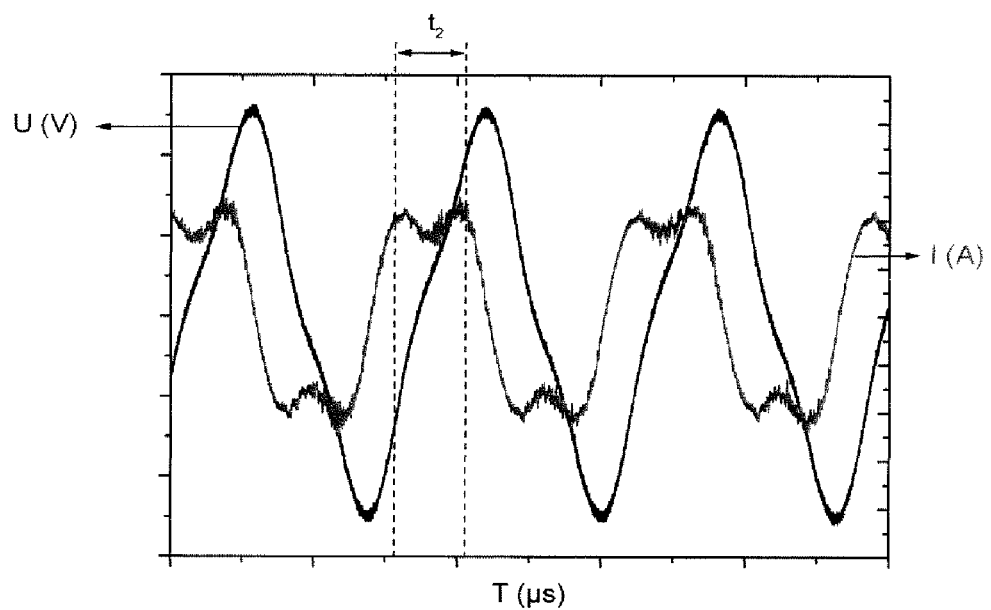
FIG. 6 is a voltage/current oscillogram obtained thanks to the process of the invention.

In the present case, it has been found that interposing an induction coil in the circuit gives rise to a distortion of the curve corresponding to the flow of current through the plasma, as shown in FIG. 6. This curve may be decomposed using the principle of Fourier series into a fundamental and a series of harmonics, the most significant ones of which, owing to their amplitude, are the $3^{rd}$ and $5^{th}$ odd harmonics. As may be seen in FIG. 6, the curve corresponding to the current flow has a kind of "plateau" over a time interval $t_2$ much longer than the interval $t_1$ observed on the curve shown in FIG. 5. The length of this interval may be optimized by varying the characteristics of the circuit, and in particular the frequency and the inductance of the inductor L. As a consequence, in the installation of the invention, by interposing an adjustable induction coil of suitable characteristics, it is possible to obtain, all other things being equal, not only an increase in active power but also a longer discharge time and, as a consequence, a much better energy efficiency.

Figure 7:
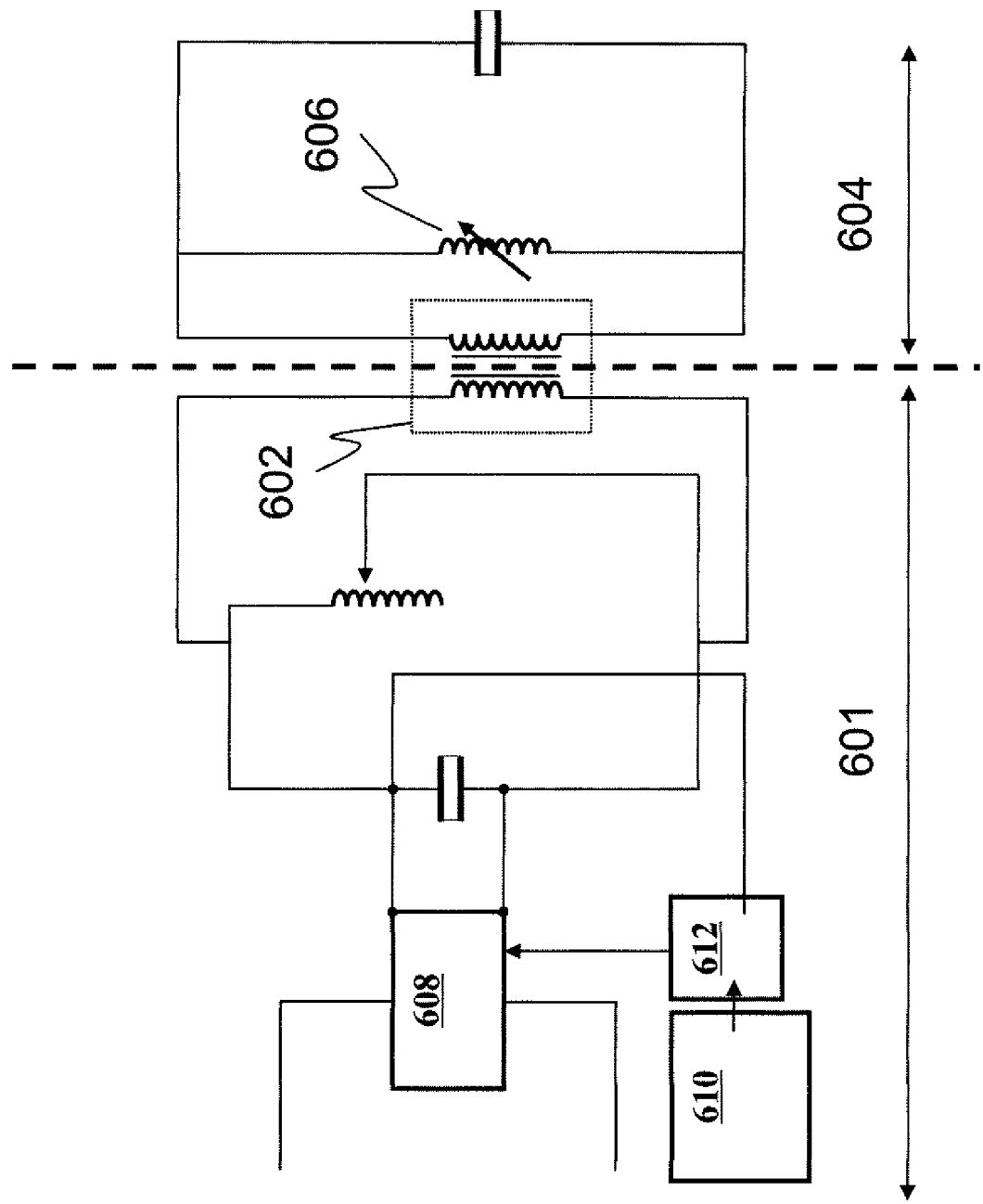
FIG. 7 is a more detailed equivalent circuit diagram of the power supply system for the installation of the invention.

FIG. 7 is a more complete equivalent circuit diagram than that sketched in FIG. 4, and better demonstrates the particular features of the installation itself, if it is compared with the prior art. Referring to this circuit diagram, it may be seen that all the adjustments (filtering, compensation, etc.) making it possible to have a stabilized and optimally compensated voltage/current curve (cos φ) are essentially performed on the primary 601 of the supply transformer 602. As a consequence, the sole adjustment means necessary for achieving the phase shift shown in FIG. 6 in the secondary circuit 604 of this transformer 602 is the variable induction coil 606, designed especially to work at very high voltage and placed in parallel with the plasma generator.

The power supply is therefore controlled in the following manner: an aperiodic generator is used consisting of an inverter 608 (which converts the DC supply current to an AC current), a parallel oscillating circuit and a variable induction coil LV1 for adjusting the operating frequency and providing the correct active power. Placed in the primary circuit of the very high-power transformer there is a power controller 610 and its associated safety circuits (P/S) 612.

Thanks to the circuit diagram shown in FIG. 7, it is very simple thereafter to adjust the inductance of the induction coil LV2 in such a way that the load formed by LV2, $C_r$ and $C_p$ remains non-linear so as to promote the third-order and fifth-order harmonics that enable the stable plasma to be sustained for an appreciably longer time per half-period (see FIGS. 5 and 6).

The operations performed on the primary 601 and on the secondary 604, respectively, of the transformer therefore work in apparent contradiction: the aim is firstly (in the primary) to increase cos φ of the installation (thereby increasing its apparent efficiency) and, moreover, in the secondary, this optimum value is degraded so as to generate harmonics, which thus paradoxically increase the efficiency of plasma deposition.

If it is added that the very high-power induction coil inserted into the secondary circuit is raised to a very high voltage, the installation thus designed comprises a series of features that are paradoxical to those skilled in the art.

The active power is increased preferably by at least 10%, more preferably by at least 25% and even more preferably by at least 50%. The discharge time is increased preferably by at least 15%, more preferably by at least 30% and even more preferably by at least 60%. It should also be noted that, to determine the "optimum" inductance of the induction coil, it is necessary to take into account the intrinsic inductance of the power supply circuit (which includes a transformer), said intrinsic inductance not necessarily being negligible. Since the power supply circuit has its own resonant frequency, the inductance of L may, under certain conditions, be greatly reduced.

Among the advantages of the process as described, mention may be made of the following:
- owing to the increase in surface preparation efficiency, it is possible to reduce the amount of molecules used, thereby generating additional cost savings;
- an increase in surface preparation rate, with the corollary that the treatment time is reduced. As a consequence, it is possible for substrates moving at higher speed to be continuously treated. Conversely, the width of the treatment chamber may be reduced, hence a not insignificant space saving.
- better decomposition of the activated molecules is observed during the reactions taking place within the plasma and therefore better efficiency of surface preparation. As a consequence, surfaces may be prepared without having to have pretreatment stages.

Figure 8:
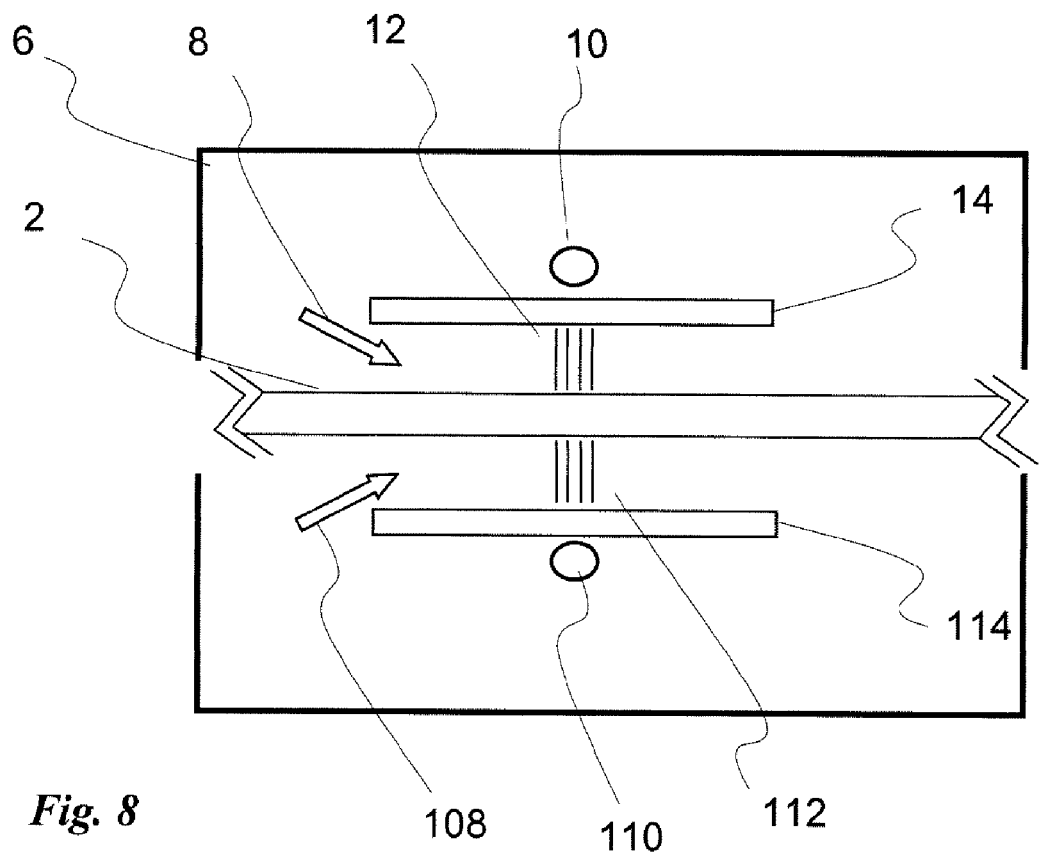
FIG. 8 is a schematic side view of one embodiment of an installation open at both its ends for two-side substrate surface preparation according to the invention.

Finally, it is also possible, as shown in FIG. 8, by a judicious choice of the characteristics, to work simultaneously on both sides of the substrate, since there is the possibility, using various tricks (physical separation or extraction apparatus suitably positioned), of introducing different molecules 8, 108 on either side of the substrate in the two plasma zones (12, 112). Furthermore, the distance between the substrate 1 to be prepared and the two electrodes (10, 110) covered with dielectrics (14, 114) may also be adjusted according to the desired preparation criteria. It goes without saying that the equivalent circuit diagram for such an installation is more complex and that it is possible to control the characteristics thereof only by the presence of the adjustable inductor characteristic of the installation according to the invention. In addition, the presence of two gaps acting as capacitors in series a priori reduces the discharge current, hence the benefit of the present invention.

Figure 9:
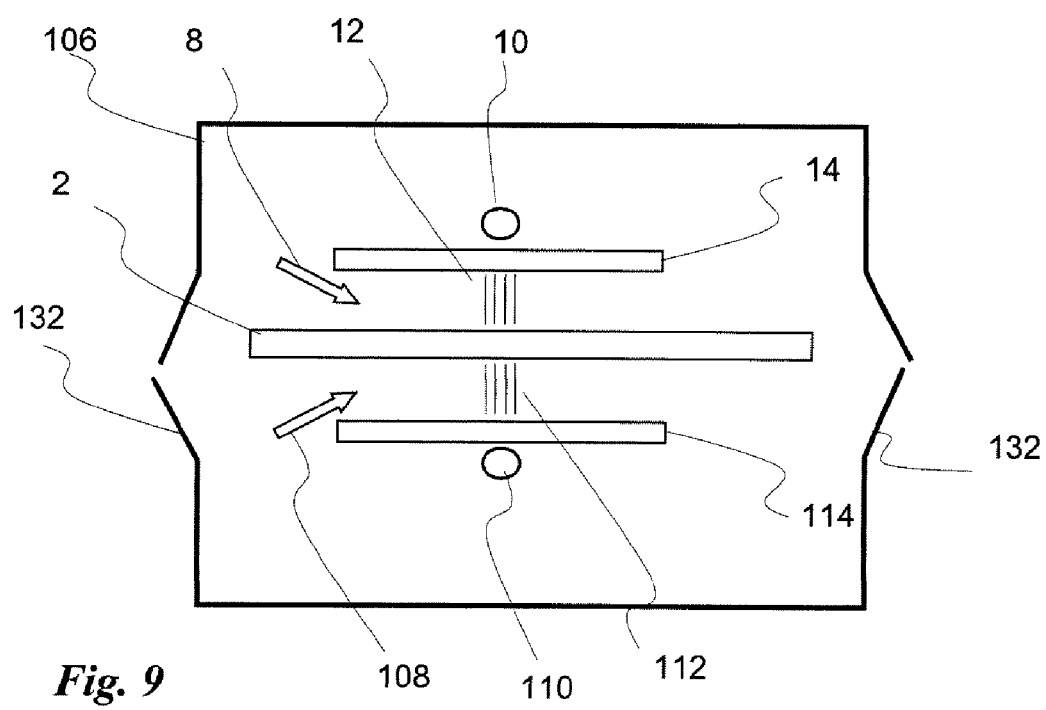
FIG. 9 is a schematic side view of one embodiment of an installation closed at both its ends for two-side substrate surface preparation according to the invention.

It goes without saying that what has been described above for a continuous surface preparation installation applies mutatis mutandis to an open installation relating to discontinuous substrates, such as, for example, precut volumes of glass. FIG. 9 shows a closed chamber (106) designed for discontinuous substrate surface preparation. In this case, one or two closure devices (132) make it possible either to work at atmospheric pressure or to work at pressures well away from atmospheric pressure (typically between $10^{-1}$ Pa and 110 kPa) (in the case of the installation shown in FIG. 1, it is necessary to use powerful extraction devices to move away from ambient pressure). In the case of a process operating at reduced pressure, it is possible to work with larger gaps or with substrates (in the case of an insulating surface) of greater thickness. Such a surface preparation installation may for example be incorporated into a film deposition line working at low pressure, of the magnetron sputtering type, the surface preparation obviously taking place before the deposition phase.

The advantages associated with generating a plasma on both sides of a substrate are numerous. In fact, the number of technical applications for a substrate treated on both sides is ever increasing.

FIG. 10 is a variant of the installation shown in FIG. 9. If the substrate is insulating, under the conditions prevailing in the preparation chamber, said substrate itself may form a dielectric barrier, giving us the possibility of not having to use an additional dielectric barrier. It is thus possible to dispense with at least one additional dielectric barrier (14, 114).

FIG. 11 is a simplified representation of one embodiment of the compensating induction coil 20 for the installation of the invention. This induction coil 20 is essentially made up of a winding 22 wound around a mandrel 24. Since the voltage across its terminals may be 60 kV, the choice of material used for the mandrel supporting the winding is very important. Advantageously, Acculon was used. A plunger core 26, carefully insulated and mechanically connected to a positioning device 28 controlled by a control system, is placed inside this mandrel 24. In view of the particular operating conditions that this induction coil must face in use, a series of innovations in its practical construction has been adopted. Thus, the winding 22 is made with a bundle of copper wires (see FIG. 12), which are insulated so as to increase the flow cross section for the HF current (taking into account the skin effect) and also to reduce heating. Thus, it is possible to divide the total HF current by a factor of 50 by producing a conductor bundle consisting of 50 mutually insulated strands. The winding pitch is fixed so that the risk of inter-turn arcing is as low as possible. A winding made of a single ply is therefore preferable, although it has the consequence that the device in its entirety is large. The position of the magnetic core 26, and therefore the inductance of the induction coil 20, is adjusted by remote control so that this operation can be carried out without danger to the operator.

It should be obvious to a person skilled in the art that the present invention is not limited to the exemplary embodiments illustrated and described above. The invention comprises each of the novel features and also combinations thereof. The presence of reference numbers cannot be considered to be limiting. The use of the term "comprises" or the term "includes" can in no way exclude the presence of other elements, other than those mentioned. The use of the indefinite article "a" or "an" to introduce an element does not exclude the presence of a plurality of these elements. The present invention has been described in relation to specific embodiments, which are purely illustrative and must not be considered to be limiting.

The invention claimed is:

1. A process for surface preparation of an inorganic substrate, the process comprising the steps of:
    (A) introducing a double-sided substrate into or making the double-sided substrate run through a reaction chamber having two ends and filled with an atmosphere in which at least two electrodes are placed, and at least one dielectric barrier being placed between the at least two electrodes;
    (B) providing a transformer having a primary circuit and a secondary circuit;
    (C) generating, in the secondary circuit of the transformer, a voltage, a frequency of the voltage being in a range from 10 kHz to 1000 kHz, said voltage generates a filamentary plasma between the at least two electrodes;
    (D) providing an adjustable inductor having an inductance placed in parallel with the secondary circuit of the transformer to reduce a phase shift between the voltage and a current that is generated in the secondary circuit of the transformer;
    (E) introducing molecules of at least one compound into the reaction chamber, said molecules, upon contact with the filamentary plasma, generate active species, which react with a surface of the double-sided substrate;
    (F) adjusting the voltage and/or the frequency delivered by the secondary circuit and the inductance of the adjustable inductor at a start of or during the process;
    (G) keeping the double-sided substrate in the reaction chamber to obtain a surface preparation on at least one of the sides of said double-sided substrate; and
    (H) adjusting the voltage and/or the frequency delivered by the secondary circuit generating the voltage and the inductance of the adjustable inductor to amplify production of harmonics extending a time during which the voltage remains above the voltage for sustaining the filamentary plasma.

2. The process according to claim 1, wherein third-order and fifth-order harmonics are amplified.

3. The process according to claim 1, further comprising the step of:
    (I) varying a position and/or a configuration of at least one of the at least two electrodes.

4. The process according to claim 1, further comprising the step of:
    (J) bringing the atmosphere in the reaction chamber to a predetermined pressure.

5. The process according to claim 1, wherein the chamber is open and the two ends include an entry zone and an exit zone for the double-sided substrate.

6. The process according to claim 1, wherein the reaction chamber is closed at the two ends.

7. The process according to claim 1, wherein the double-sided substrate is an insulator and forms a dielectric barrier.

8. The process according to claim 1, wherein the double-sided substrate is a conductor and forms an electrode.

* * * * *